(12) United States Patent
Kraus et al.

(10) Patent No.: US 7,575,978 B2
(45) Date of Patent: Aug. 18, 2009

(54) METHOD FOR MAKING CONDUCTIVE NANOPARTICLE CHARGE STORAGE ELEMENT

(75) Inventors: Brenda D Kraus, Boise, ID (US); Eugene P. Marsh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 156 days.

(21) Appl. No.: 11/197,184

(22) Filed: Aug. 4, 2005

(65) Prior Publication Data

US 2007/0092989 A1    Apr. 26, 2007

(51) Int. Cl.
 *H01L 21/336* (2006.01)
(52) U.S. Cl. ............... 438/288; 438/260; 438/261; 438/964; 977/943
(58) Field of Classification Search ......... 438/240, 438/257, 260–261, 264, 287–288, 400, 591, 438/593–594, 596, 964; 977/773–774, 810–811, 977/932, 943; 257/314–317, 321, 324–325
See application file for complete search history.

(56) References Cited

U.S. PATENT DOCUMENTS

| | | |
|---|---|---|
| 5,119,329 A | 6/1992 | Evans et al. |
| 5,149,596 A | 9/1992 | Smith et al. |
| 5,223,001 A | 6/1993 | Saeki |
| 5,304,622 A | 4/1994 | Ikai et al. |
| 5,434,878 A | 7/1995 | Lawandy |
| 5,455,489 A | 10/1995 | Bhargava |
| 5,516,588 A | 5/1996 | van den Berg et al. |
| 5,585,020 A | 12/1996 | Becker et al. |
| 5,652,061 A | 7/1997 | Jeng et al. |
| 5,662,834 A | 9/1997 | Schulz et al. |
| 5,714,766 A * | 2/1998 | Chen et al. ............ 257/17 |
| 5,770,022 A | 6/1998 | Chang et al. |
| 5,772,760 A | 6/1998 | Gruen et al. |
| 5,851,880 A | 12/1998 | Ikegami |
| 5,874,134 A | 2/1999 | Rao et al. |
| 5,882,779 A | 3/1999 | Lawandy |
| 5,923,056 A | 7/1999 | Lee et al. |
| 5,939,146 A | 8/1999 | Lavernia |
| 5,962,132 A | 10/1999 | Chang et al. |
| 5,989,511 A | 11/1999 | Gruen et al. |
| 6,020,024 A | 2/2000 | Maiti et al. |
| 6,020,243 A | 2/2000 | Wallace et al. |
| 6,025,034 A | 2/2000 | Strutt et al. |

(Continued)

OTHER PUBLICATIONS

Reidy, S., et al.; J. Vac. Sci. Technol. B 21(3), May/Jun. 2003 pp. 970-974.*

(Continued)

*Primary Examiner*—Douglas M Menz
*Assistant Examiner*—Matthew W Such
(74) *Attorney, Agent, or Firm*—Schwegman, Lundberg & Woessner, P.A.

(57) ABSTRACT

Isolated conductive nanoparticles on a dielectric layer and methods of fabricating such isolated conductive nanoparticles provide charge storage units in electronic structures for use in a wide range of electronic devices and systems. The isolated conductive nanoparticles may be used as a floating gate in a flash memory. In an embodiment, conductive nanoparticles are deposited on a dielectric layer by a plasma-assisted deposition process such that each conductive nanoparticle is isolated from the other conductive nanoparticles to configure the conductive nanoparticles as charge storage elements.

78 Claims, 4 Drawing Sheets

```
                                                      110
┌──────────────────────────────────────────────────────┐
│ FORM A DIELECTRIC LAYER IN AN INTEGRATED CIRCUIT ON A SUBSTRATE │
└──────────────────────────────────────────────────────┘
                            │
                            ▼                         120
┌──────────────────────────────────────────────────────┐
│ DEPOSIT CONDUCTIVE NANOPARTICLES ON THE DIELECTRIC LAYER BY A │
│ PLASMA ASSISTED DEPOSITION PROCESS SUCH THAT EACH CONDUCTIVE │
│ NANOPARTICLE IS ISOLATED FROM THE OTHER CONDUCTIVE NANOPARTICLES TO │
│ CONFIGURE THE CONDUCTIVE NANOPARTICELS AS A CHARGE STORAGE LAYER │
└──────────────────────────────────────────────────────┘
```

U.S. PATENT DOCUMENTS

| | | | |
|---|---|---|---|
| 6,060,743 A * | 5/2000 | Sugiyama et al. | 257/321 |
| 6,063,705 A * | 5/2000 | Vaartstra | 438/681 |
| 6,075,691 A | 6/2000 | Duenas et al. | |
| RE36,760 E | 7/2000 | Bloomquist et al. | |
| 6,129,928 A | 10/2000 | Sarangapani et al. | |
| 6,140,181 A | 10/2000 | Forbes et al. | |
| 6,146,976 A | 11/2000 | Stecher et al. | |
| H1924 H | 12/2000 | Zabinski et al. | |
| 6,162,712 A * | 12/2000 | Baum et al. | 438/580 |
| 6,184,550 B1 | 2/2001 | Van Buskirk et al. | |
| 6,194,237 B1 * | 2/2001 | Kim et al. | |
| 6,208,881 B1 | 3/2001 | Champeau | |
| 6,218,293 B1 | 4/2001 | Kraus et al. | |
| 6,232,643 B1 | 5/2001 | Forbes et al. | |
| 6,246,606 B1 | 6/2001 | Forbes et al. | |
| 6,277,448 B2 | 8/2001 | Strutt et al. | |
| 6,291,341 B1 * | 9/2001 | Sharan et al. | 438/648 |
| 6,297,095 B1 * | 10/2001 | Muralidhar et al. | 438/257 |
| 6,313,015 B1 | 11/2001 | Lee et al. | |
| 6,313,035 B1 | 11/2001 | Sandhu et al. | |
| 6,323,081 B1 | 11/2001 | Marsh | |
| 6,323,511 B1 | 11/2001 | Marsh | |
| 6,331,282 B1 | 12/2001 | Manthiram et al. | |
| 6,342,445 B1 | 1/2002 | Marsh | |
| 6,346,477 B1 * | 2/2002 | Kaloyeros et al. | 438/680 |
| 6,351,411 B2 | 2/2002 | Forbes et al. | |
| 6,365,519 B2 | 4/2002 | Kraus et al. | |
| 6,392,257 B1 | 5/2002 | Ramdani et al. | |
| 6,395,650 B1 | 5/2002 | Callegari et al. | |
| 6,403,414 B2 | 6/2002 | Marsh | |
| 6,407,435 B1 | 6/2002 | Ma et al. | |
| 6,414,543 B1 | 7/2002 | Beigel et al. | |
| 6,447,764 B1 | 9/2002 | Bayer et al. | |
| 6,447,848 B1 | 9/2002 | Chow et al. | |
| 6,448,601 B1 | 9/2002 | Forbes et al. | |
| 6,458,431 B2 | 10/2002 | Hill et al. | |
| 6,472,632 B1 | 10/2002 | Peterson et al. | |
| 6,495,458 B2 | 12/2002 | Marsh | |
| 6,496,034 B2 | 12/2002 | Forbes et al. | |
| 6,506,666 B2 | 1/2003 | Marsh | |
| 6,531,727 B2 | 3/2003 | Forbes et al. | |
| 6,541,280 B2 | 4/2003 | Kaushik et al. | |
| 6,545,314 B2 | 4/2003 | Forbes et al. | |
| 6,559,014 B1 | 5/2003 | Jeon | |
| 6,559,491 B2 | 5/2003 | Forbes et al. | |
| 6,566,147 B2 | 5/2003 | Basceri et al. | |
| 6,572,836 B1 | 6/2003 | Schulz et al. | |
| 6,580,124 B1 | 6/2003 | Cleeves et al. | |
| 6,586,785 B2 | 7/2003 | Flagan et al. | |
| 6,586,797 B2 | 7/2003 | Forbes et al. | |
| 6,587,408 B1 | 7/2003 | Jacobson et al. | |
| 6,592,839 B2 | 7/2003 | Gruen et al. | |
| 6,613,695 B2 | 9/2003 | Pomarede et al. | |
| 6,617,634 B2 | 9/2003 | Marsh et al. | |
| 6,638,575 B1 | 10/2003 | Chen et al. | |
| 6,639,268 B2 | 10/2003 | Forbes et al. | |
| 6,642,567 B1 | 11/2003 | Marsh | |
| 6,642,782 B2 | 11/2003 | Beigel et al. | |
| 6,645,569 B2 | 11/2003 | Cramer et al. | |
| 6,653,591 B1 | 11/2003 | Peterson et al. | |
| 6,656,792 B2 * | 12/2003 | Choi et al. | 438/257 |
| 6,656,835 B2 | 12/2003 | Marsh et al. | |
| 6,660,631 B1 | 12/2003 | Marsh | |
| 6,669,823 B1 | 12/2003 | Sarkas et al. | |
| 6,669,996 B2 | 12/2003 | Ueno et al. | |
| 6,673,701 B1 | 1/2004 | Marsh et al. | |
| 6,677,204 B2 | 1/2004 | Cleeves et al. | |
| 6,689,192 B1 | 2/2004 | Phillips et al. | |
| 6,713,812 B1 * | 3/2004 | Hoefler et al. | 257/316 |
| 6,723,606 B2 | 4/2004 | Flagan et al. | |
| 6,734,480 B2 | 5/2004 | Chung et al. | |
| 6,746,893 B1 | 6/2004 | Forbes et al. | |
| 6,753,567 B2 | 6/2004 | Maria et al. | |
| 6,754,108 B2 | 6/2004 | Forbes | |
| 6,755,886 B2 | 6/2004 | Phillips | |
| 6,756,292 B2 * | 6/2004 | Lee et al. | 438/591 |
| 6,767,419 B1 | 7/2004 | Branagan | |
| 6,767,582 B1 | 7/2004 | Elers | |
| 6,784,101 B1 | 8/2004 | Yu et al. | |
| 6,787,122 B2 | 9/2004 | Zhou | |
| 6,801,415 B2 | 10/2004 | Slaughter et al. | |
| 6,804,136 B2 | 10/2004 | Forbes | |
| 6,815,781 B2 | 11/2004 | Vyvoda et al. | |
| 6,818,067 B2 | 11/2004 | Doering et al. | |
| 6,830,676 B2 | 12/2004 | Deevi | |
| 6,831,310 B1 | 12/2004 | Mathew et al. | |
| 6,839,280 B1 | 1/2005 | Chindalore et al. | |
| 6,842,370 B2 | 1/2005 | Forbes | |
| 6,844,319 B1 | 1/2005 | Poelstra et al. | |
| 6,849,948 B2 * | 2/2005 | Chen et al. | 257/758 |
| 6,853,587 B2 | 2/2005 | Forbes | |
| 6,859,093 B1 | 2/2005 | Beigel | |
| 6,863,933 B2 | 3/2005 | Cramer et al. | |
| 6,884,739 B2 | 4/2005 | Ahn et al. | |
| 6,887,758 B2 * | 5/2005 | Chindalore et al. | 438/257 |
| 6,888,739 B2 | 5/2005 | Forbes | |
| 6,896,617 B2 | 5/2005 | Daly | |
| 6,917,112 B2 | 7/2005 | Basceri et al. | |
| 6,921,702 B2 | 7/2005 | Ahn et al. | |
| 6,933,225 B2 | 8/2005 | Werkhoven et al. | |
| 6,950,340 B2 | 9/2005 | Bhattacharyya | |
| 6,952,032 B2 | 10/2005 | Forbes et al. | |
| 6,955,968 B2 | 10/2005 | Forbes et al. | |
| 6,958,937 B2 | 10/2005 | Forbes et al. | |
| 6,963,103 B2 | 11/2005 | Forbes | |
| 6,982,230 B2 | 1/2006 | Cabral, Jr. et al. | |
| 7,012,297 B2 | 3/2006 | Bhattacharyya | |
| 7,019,351 B2 | 3/2006 | Eppich et al. | |
| 7,026,694 B2 | 4/2006 | Ahn et al. | |
| 7,037,574 B2 * | 5/2006 | Paranjpe et al. | 428/200 |
| 7,042,043 B2 | 5/2006 | Forbes et al. | |
| 7,049,192 B2 | 5/2006 | Ahn et al. | |
| 7,068,544 B2 | 6/2006 | Forbes et al. | |
| 7,074,673 B2 | 7/2006 | Forbes | |
| 7,075,829 B2 | 7/2006 | Forbes | |
| 7,084,078 B2 | 8/2006 | Ahn et al. | |
| 7,087,954 B2 | 8/2006 | Forbes | |
| 7,112,494 B2 | 9/2006 | Forbes | |
| 7,112,841 B2 | 9/2006 | Eldridge et al. | |
| 7,129,553 B2 | 10/2006 | Ahn et al. | |
| 7,132,329 B1 * | 11/2006 | Hong et al. | 438/257 |
| 7,133,315 B2 | 11/2006 | Forbes | |
| 7,135,734 B2 | 11/2006 | Eldridge et al. | |
| 7,138,336 B2 * | 11/2006 | Lee et al. | 438/680 |
| 7,154,778 B2 | 12/2006 | Forbes | |
| 7,160,817 B2 | 1/2007 | Marsh | |
| 7,166,886 B2 | 1/2007 | Forbes | |
| 7,169,673 B2 | 1/2007 | Ahn et al. | |
| 7,187,587 B2 | 3/2007 | Forbes | |
| 7,192,824 B2 | 3/2007 | Ahn et al. | |
| 7,192,892 B2 | 3/2007 | Ahn et al. | |
| 7,195,999 B2 | 3/2007 | Forbes et al. | |
| 7,199,023 B2 | 4/2007 | Ahn et al. | |
| 7,205,218 B2 | 4/2007 | Ahn et al. | |
| 7,221,017 B2 | 5/2007 | Forbes et al. | |
| 7,221,586 B2 | 5/2007 | Forbes et al. | |
| 7,235,854 B2 | 6/2007 | Ahn et al. | |
| 7,250,338 B2 | 7/2007 | Bhattacharyya | |
| 7,257,022 B2 | 8/2007 | Forbes | |
| 7,274,067 B2 | 9/2007 | Forbes | |
| 7,279,413 B2 | 10/2007 | Park et al. | |
| 7,297,617 B2 | 11/2007 | Farrar et al. | |
| 7,301,221 B2 | 11/2007 | Farrar et al. | |
| 7,309,664 B1 | 12/2007 | Marzolin et al. | |

| | | |
|---|---|---|
| 7,312,494 B2 | 12/2007 | Ahn et al. |
| 7,326,980 B2 | 2/2008 | Ahn et al. |
| 2001/0012698 A1* | 8/2001 | Hayashi et al. ............. 438/782 |
| 2002/0000593 A1* | 1/2002 | Nishiyama et al. .......... 257/296 |
| 2002/0013052 A1* | 1/2002 | Visokay ...................... 438/681 |
| 2002/0019116 A1 | 2/2002 | Sandhu et al. |
| 2002/0019125 A1 | 2/2002 | Juengling et al. |
| 2002/0037320 A1 | 3/2002 | Denes et al. |
| 2002/0037603 A1 | 3/2002 | Eldridge et al. |
| 2002/0046993 A1 | 4/2002 | Peterson et al. |
| 2002/0119916 A1 | 8/2002 | Hassan |
| 2002/0120297 A1 | 8/2002 | Shadduck |
| 2002/0132374 A1 | 9/2002 | Basceri et al. |
| 2002/0148566 A1 | 10/2002 | Kitano et al. |
| 2002/0170671 A1 | 11/2002 | Matsushita et al. |
| 2002/0187091 A1 | 12/2002 | Deevi |
| 2002/0190251 A1 | 12/2002 | Kunitake et al. |
| 2002/0192366 A1 | 12/2002 | Cramer et al. |
| 2002/0193040 A1 | 12/2002 | Zhou |
| 2002/0197793 A1* | 12/2002 | Dornfest et al. ............. 438/253 |
| 2003/0001190 A1* | 1/2003 | Basceri et al. .............. 257/306 |
| 2003/0003635 A1 | 1/2003 | Paranjpe et al. |
| 2003/0008243 A1 | 1/2003 | Ahn et al. |
| 2003/0030074 A1 | 2/2003 | Walker et al. |
| 2003/0049900 A1 | 3/2003 | Forbes et al. |
| 2003/0106490 A1 | 6/2003 | Jallepally et al. |
| 2003/0107402 A1 | 6/2003 | Forbes et al. |
| 2003/0108612 A1 | 6/2003 | Xu et al. |
| 2003/0141560 A1 | 7/2003 | Sun |
| 2003/0143801 A1* | 7/2003 | Basceri et al. .............. 438/240 |
| 2003/0148577 A1 | 8/2003 | Merkulov et al. |
| 2003/0152700 A1 | 8/2003 | Asmussen et al. |
| 2003/0161782 A1 | 8/2003 | Kim |
| 2003/0162587 A1 | 8/2003 | Tanamoto et al. |
| 2003/0175411 A1 | 9/2003 | Kodas et al. |
| 2003/0176049 A1 | 9/2003 | Hegde et al. |
| 2003/0183306 A1 | 10/2003 | Hehmann et al. |
| 2003/0183901 A1 | 10/2003 | Kanda et al. |
| 2003/0185983 A1 | 10/2003 | Morfill et al. |
| 2003/0196513 A1* | 10/2003 | Phillips et al. ................ 75/346 |
| 2003/0207593 A1 | 11/2003 | Derderian et al. |
| 2003/0218199 A1 | 11/2003 | Forbes et al. |
| 2003/0230479 A1 | 12/2003 | Sarkas et al. |
| 2003/0231992 A1 | 12/2003 | Sarkas et al. |
| 2003/0234420 A1 | 12/2003 | Forbes |
| 2003/0235064 A1* | 12/2003 | Batra et al. .................. 365/100 |
| 2003/0235066 A1 | 12/2003 | Forbes |
| 2003/0235076 A1 | 12/2003 | Forbes |
| 2003/0235961 A1 | 12/2003 | Metzner et al. |
| 2004/0004247 A1 | 1/2004 | Forbes et al. |
| 2004/0009118 A1 | 1/2004 | Phillips et al. |
| 2004/0014060 A1 | 1/2004 | Hoheisel et al. |
| 2004/0023516 A1 | 2/2004 | Londergan et al. |
| 2004/0032773 A1 | 2/2004 | Forbes |
| 2004/0033701 A1 | 2/2004 | Ahn et al. |
| 2004/0042128 A1 | 3/2004 | Slaughter et al. |
| 2004/0045807 A1 | 3/2004 | Sarkas et al. |
| 2004/0046130 A1 | 3/2004 | Rao et al. |
| 2004/0051139 A1 | 3/2004 | Kanda et al. |
| 2004/0055892 A1 | 3/2004 | Oh et al. |
| 2004/0058385 A1 | 3/2004 | Abel et al. |
| 2004/0065171 A1 | 4/2004 | Hearley et al. |
| 2004/0086897 A1* | 5/2004 | Mirkin et al. .................. 435/6 |
| 2004/0107906 A1* | 6/2004 | Collins et al. ......... 118/723.001 |
| 2004/0110347 A1 | 6/2004 | Yamashita |
| 2004/0126649 A1 | 7/2004 | Chen et al. |
| 2004/0127001 A1 | 7/2004 | Colburn et al. |
| 2004/0130951 A1 | 7/2004 | Forbes |
| 2004/0131795 A1 | 7/2004 | Kuo et al. |
| 2004/0131865 A1 | 7/2004 | Kim et al. |
| 2004/0135951 A1 | 7/2004 | Stumbo et al. |
| 2004/0135997 A1 | 7/2004 | Chan et al. |
| 2004/0145001 A1 | 7/2004 | Kanda et al. |
| 2004/0147098 A1 | 7/2004 | Mazen et al. |
| 2004/0149759 A1 | 8/2004 | Moser et al. |
| 2004/0158028 A1 | 8/2004 | Buhler |
| 2004/0165412 A1 | 8/2004 | Forbes |
| 2004/0202032 A1 | 10/2004 | Forbes |
| 2004/0206957 A1* | 10/2004 | Inoue et al. .................... 257/59 |
| 2004/0212426 A1 | 10/2004 | Beigel |
| 2004/0219783 A1 | 11/2004 | Ahn et al. |
| 2004/0224505 A1 | 11/2004 | Nguyen et al. |
| 2004/0245085 A1 | 12/2004 | Srinivasan |
| 2004/0258192 A1 | 12/2004 | Angeliu et al. |
| 2004/0266107 A1 | 12/2004 | Chindalore et al. |
| 2005/0007820 A1 | 1/2005 | Chindalore et al. |
| 2005/0011748 A1 | 1/2005 | Beck et al. |
| 2005/0019365 A1 | 1/2005 | Frauchiger et al. |
| 2005/0019836 A1 | 1/2005 | Vogel et al. |
| 2005/0023574 A1 | 2/2005 | Forbes et al. |
| 2005/0023584 A1 | 2/2005 | Derderian et al. |
| 2005/0023594 A1 | 2/2005 | Ahn et al. |
| 2005/0026349 A1 | 2/2005 | Forbes et al. |
| 2005/0026375 A1 | 2/2005 | Forbes |
| 2005/0029547 A1 | 2/2005 | Ahn et al. |
| 2005/0031785 A1 | 2/2005 | Carlisle et al. |
| 2005/0035430 A1 | 2/2005 | Beigel |
| 2005/0036370 A1 | 2/2005 | Forbes |
| 2005/0037374 A1 | 2/2005 | Melker et al. |
| 2005/0040034 A1* | 2/2005 | Landgraf et al. ........ 204/192.38 |
| 2005/0041455 A1 | 2/2005 | Beigel et al. |
| 2005/0041503 A1 | 2/2005 | Chindalore et al. |
| 2005/0048414 A1 | 3/2005 | Harnack et al. |
| 2005/0048570 A1 | 3/2005 | Weber et al. |
| 2005/0048796 A1 | 3/2005 | Numasawa et al. |
| 2005/0053826 A1 | 3/2005 | Wang et al. |
| 2005/0061785 A1 | 3/2005 | Schroder et al. |
| 2005/0064185 A1 | 3/2005 | Buretea et al. |
| 2005/0077519 A1 | 4/2005 | Ahn et al. |
| 2005/0124174 A1 | 6/2005 | Ahn et al. |
| 2005/0151261 A1* | 7/2005 | Kellar et al. ................. 257/758 |
| 2005/0157549 A1 | 7/2005 | Mokhlesi et al. |
| 2005/0169054 A1 | 8/2005 | Forbes |
| 2005/0277256 A1 | 12/2005 | Ahn et al. |
| 2006/0001151 A1 | 1/2006 | Ahn et al. |
| 2006/0008966 A1 | 1/2006 | Forbes et al. |
| 2006/0024975 A1 | 2/2006 | Ahn et al. |
| 2006/0027882 A1 | 2/2006 | Mokhlesi |
| 2006/0035405 A1 | 2/2006 | Park et al. |
| 2006/0043504 A1 | 3/2006 | Ahn et al. |
| 2006/0046383 A1* | 3/2006 | Chen et al. ................... 438/257 |
| 2006/0046384 A1* | 3/2006 | Joo et al. ..................... 438/257 |
| 2006/0105523 A1* | 5/2006 | Afzali-Ardakani et al. .. 438/257 |
| 2006/0118853 A1* | 6/2006 | Takata et al. ................. 257/314 |
| 2006/0125030 A1 | 6/2006 | Ahn et al. |
| 2006/0170032 A1 | 8/2006 | Bhattacharyya |
| 2006/0176645 A1 | 8/2006 | Ahn et al. |
| 2006/0177975 A1 | 8/2006 | Ahn et al. |
| 2006/0183272 A1 | 8/2006 | Ahn et al. |
| 2006/0189154 A1 | 8/2006 | Ahn et al. |
| 2006/0194438 A1* | 8/2006 | Rao et al. ..................... 438/720 |
| 2006/0228868 A1 | 10/2006 | Ahn et al. |
| 2006/0231889 A1* | 10/2006 | Chen et al. ................... 257/325 |
| 2006/0237764 A1 | 10/2006 | Ahn et al. |
| 2006/0240626 A1 | 10/2006 | Forbes |
| 2006/0246741 A1 | 11/2006 | Ahn et al. |
| 2006/0252202 A1* | 11/2006 | Dai et al. ..................... 438/257 |
| 2006/0252211 A1 | 11/2006 | Ahn et al. |
| 2006/0258097 A1 | 11/2006 | Forbes et al. |
| 2006/0261376 A1 | 11/2006 | Forbes et al. |
| 2006/0261397 A1 | 11/2006 | Ahn et al. |
| 2006/0263972 A1 | 11/2006 | Ahn et al. |
| 2006/0263981 A1 | 11/2006 | Forbes |
| 2006/0264064 A1 | 11/2006 | Ahn et al. |
| 2006/0274580 A1 | 12/2006 | Forbes |
| 2006/0284246 A1 | 12/2006 | Forbes et al. |

| | | | |
|---|---|---|---|
| 2007/0018342 A1* | 1/2007 | Sandhu et al. ....... 257/E29.071 |
| 2007/0020835 A1 | 1/2007 | Ahn et al. |
| 2007/0047319 A1 | 3/2007 | Bhattacharyya |
| 2007/0048953 A1 | 3/2007 | Gealy et al. |
| 2007/0048989 A1 | 3/2007 | Ahn et al. |
| 2007/0049023 A1 | 3/2007 | Ahn et al. |
| 2007/0087563 A1 | 4/2007 | Ahn et al. |
| 2007/0090441 A1 | 4/2007 | Ahn et al. |
| 2007/0105313 A1 | 5/2007 | Forbes |
| 2007/0111544 A1 | 5/2007 | Ahn |
| 2007/0141832 A1 | 6/2007 | Farrar |
| 2007/0178643 A1 | 8/2007 | Forbes et al. |
| 2007/0187772 A1 | 8/2007 | Ahn et al. |
| 2007/0187831 A1 | 8/2007 | Ahn et al. |
| 2007/0234949 A1 | 10/2007 | Ahn et al. |
| 2008/0032424 A1 | 2/2008 | Ahn et al. |
| 2008/0048225 A1 | 2/2008 | Ahn et al. |
| 2008/0057659 A1 | 3/2008 | Forbes et al. |
| 2008/0057690 A1 | 3/2008 | Forbes et al. |

OTHER PUBLICATIONS

Rhee, H. S., et al.; Journal of the Electrochemical Society, 146(6), (1999), pp. 2720-2724.*

Lee, C., et al. "Self-Assembly of Metal Nanocrystals on Ultrathin Oxide for Nonvolatile Memory Applications." J. Elect. Mater., vol. 34, No. 1 (Jan. 2005): pp. 1-11.*

Liu, Z., et al. "Metal Nanocrystal Memories—Part I: Device Design and Fabrication." IEEE Trans. Elect. Dev., vol. 49, (Sep. 2002): pp. 1606-1613.*

Leskela, M , "ALD precursor chemistry: Evolution and future challenges", *Journal de Physique IV (Proceedings)*, 9(8), (Sep. 1999),837-852.

Sneh, Ofer , "Thin film atomic layer deposition equipment for semiconductor processing", *Thin Solid Films*, 402(1-2), (Jan. 2002),248-261.

Suntola, T. , "Atomic Layer Epitaxy", *Handbook of Crystal Growth, 3; Thin Films of Epitaxy, Part B; Growth Mechanics and Dynamics*, Amsterdam,(1994),601-663.

Suntola, Tuomo , "Atomic layer epitaxy", *Thin Solid Films*, 216(1), (Aug. 28, 1992),84-89.

Wilk, G. D., "High-k gate dielectrics: Current status and materials properties considerations", *Journal of Applied Physics*, 89(10), (May 2001),5243-5275.

Ahn, et al., "Ald of Zr-Substituted $BaTiO_3$ Films As Gate Dielectrics", U.S. Appl. No. 11/498,559, filed Aug. 3, 2006.

Ahn, Kie Y., et al., "Hafnium Lanthanide Oxynitride Films", U.S. Appl. No. 11/515,143, filed Aug. 31, 2006.

Ahn, Kie Y., "Magnesium-Doped Zinc Oxide Structures and Methods", U.S. Appl. No. 11/706,820, filed Feb. 13, 2007.

Ahn, Kie Y., et al., "Methods to Form Dielectric Structures In Semiconductor Devices and Resulting Devices", U.S. Appl. No. 11/581,675, filed Aug. 16, 2006.

Ahn, Kie Y., "Molybdenum-Doped Indium Oxide Structures and Methods", U.S. Appl. No. 11/706,944, filed Feb. 13, 2007.

Ahn, Kie Y., "Tungsten-Doped Indium Oxide Structures and Methods", U.S. Appl. No. 11/706,498, filed Feb. 13, 2007.

Ahn, Kie Y., et al., "Zirconium-Doped Zinc Oxide Structures and Methods", U.S. Appl. No. 11/707,173 filed Feb. 13, 2007.

Alers, G. B., et al., "Intermixing at the tantalum oxide/silicon interface in gate dielectric structures", *Applied Physics Letters*, 73(11), (Sep. 14, 1998),1517-1519.

Atanassova, E., et al., "Breakdown Fields and Conduction Mechanisms in thin Ta2O5 Layers on Si for high density DRAMs", *Microelectronics Reliability*, 42, (2002),157-173.

Dover, V., et al., "Deposition of Uniform Zr-Sn-Ti-O Films by On-Axis Reactive Sputtering", *IEEE Electron Device Letters*, vol. 19, No. 9, (Sep. 1998),329-331.

Forbes, "Hafnium Tantalum Oxynitride High-K Dielectric and Metal Gates", U.S. Appl. No. 11/515,114, filed Aug. 31, 2005.

Forbes, Leonard, "Memory Utilizing Oxide-Conductor Nanolaminates", U.S. Appl. No. 11/496,196, filed Jul. 31, 2006.

Forbes, Leonard, et al., "Silicon Lanthanide Oxynitride Films", U.S. Appl. No. 11/514,533, filed Aug. 31, 2006.

Forbes, et al., "Tantalum Aluminum Oxynitride High-K Dielectric and Metal Gates", U.S. Appl. No. 11/514,655, filed Aug. 31, 2006.

\* cited by examiner

METHOD FOR MAKING CONDUCTIVE NANOPARTICLE CHARGE STORAGE ELEMENT

TECHNICAL FIELD

This application relates generally to semiconductor devices and device fabrication.

BACKGROUND

Generation of higher capacity electronic devices and systems rely on scaling down device dimensions to realize higher density memory devices. However, associated with increased device density due to closer spacing is word line coupling within the higher density memories. Techniques are needed to reduce word line coupling, reduce programming voltages, and enable continued scaling of devices within a memory.

SUMMARY

The abovementioned problems are addressed by embodiments of the present invention and will be understood by reading and studying the following specification. An embodiment for a method of forming an electronic device includes forming a dielectric layer in an integrated circuit and forming conductive nanoparticles on the dielectric layer to generate a charge storage layer, in which each conductive nanoparticle is isolated from the other conductive nanoparticles. In an embodiment, conductive nanoparticles may be formed by a plasma-assisted deposition process. Embodiments of structures and methods for forming such structures provide for transistors, memory devices, and electronic systems having isolated conductive nanoparticles on a dielectric layer to store charge. These and other aspects, embodiments, advantages, and features will become apparent from the following description and the referenced drawings.

DETAILED DESCRIPTION

Figure 1:
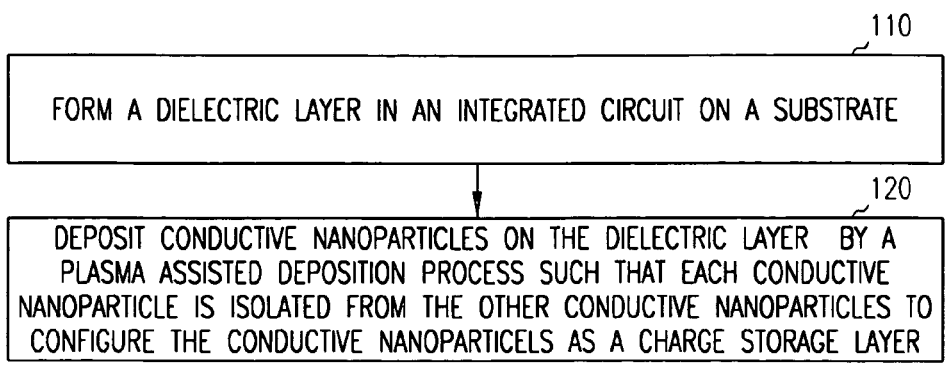
FIG. 1 depicts features of an embodiment of a method to form conductive nanoparticles on a dielectric layer to generate a charge storage layer.

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments are not necessarily mutually exclusive, as some embodiments can be combined with one or more other embodiments to form new embodiments.

The terms "wafer" and "substrate" used in the following description include any structure having an exposed surface with which to form an integrated circuit (IC) structure. The term "substrate" is understood to include semiconductor wafers. The term "substrate" is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term "conductor" is understood to generally include n-type and p-type semiconductors and the term "insulator" or "dielectric" is defined to include any material that is less electrically conductive than the materials referred to as conductors.

Herein, a nanoparticle includes a material structure whose effective diameter is measured in the nanometer range. A nanoparticle may have an effective diameter as large as 20 nanometers. Depending on the unit cell for a material, a nanoparticle of the material may include the material configured as a nanocrystal. A conductive nanoparticle is a material structured as a nanoparticle, where the material when structured in bulk form is conductive. These conductive nanoparticles are able to trap charges.

In an embodiment, a charge storage unit of an electronic device includes conductive nanoparticles on a dielectric layer, in which each conductive nanoparticle is isolated from the other conductive nanoparticles. The conductive nanoparticles may be deposited by plasma-assisted deposition techniques, which may include, but are not limited to, plasma-enhanced chemical vapor deposition (PECVD), plasma-enhanced atomic layer deposition (PEALD), and plasma-assisted physical vapor deposition (PVD). The application of a plasma may be used to roughen the deposited particles to form the nanoparticles. Further, the application of the plasma may provide for a higher density of conductive nanoparticles and improved adhesion for subsequent processing.

A charge storage unit may include a capping dielectric on the conductive nanoparticles with the conductive nanoparticles as charge storage elements. With the base dielectric layer sufficiently thin, charges may tunnel through the base dielectric layer and be trapped in the nanoparticles. The capping dielectric provides isolation from conductive elements such that the trapped charge may be stored, until an appropriate stimulus is provided to release the charge. In an embodiment, conductive nanoparticles may be used as a floating gate to replace the use of a polysilicon floating gate that is currently being used in flash memory. The isolated conductive nanoparticles may serve as a charge trapping layer to reduce programming voltage and to reduce word line coupling, as well as to enable continued scaling beyond that associated with the conventional floating gate structure.

FIG. 1 shows features of an embodiment of a method to form conductive nanoparticles on a dielectric layer to generate a charge storage unit. At 110, a dielectric layer is formed in an integrated circuit on a substrate. In an embodiment, the dielectric layer may be a silicon oxide layer. Alternatively, the dielectric layer may be a layer of a high-κ dielectric materials. High-κ materials include materials having a dielectric constant greater than silicon dioxide, for example, dielectric materials having a dielectric constant greater than about twice the dielectric constant of silicon dioxide. A set of high-κ dielectric may include, but is not limited to, $HfO_x$, $ZrO_x$, $TiO_x$, $TaO_x$, $LaAlO_x$, the lanthanide oxides, other metal oxides, and corresponding metal silicates. The dielectric layer may be a layer of an insulative nitride and/or insulative oxynitride. The dielectric layer may be structured as a dielectric stack having a number of layers of different dielectric material. The dielectric stack may be nanolaminate. The term "nanolaminate" means a composite film of ultra thin layers of two or more materials in a layered stack. Typically, each layer in a nanolaminate has a thickness of an order of magnitude in the nanometer range. Further, each individual material layer of the nanolaminate may have a thickness as low as a monolayer of the material or as high as 20 nanometers. In an embodiment, the dielectric layer formed may be structured as a tunneling dielectric allowing the movement of charge through the dielectric under appropriate stimulation. In an embodiment, a tunneling dielectric may have a thickness of 30 Å or less.

At 120, conductive nanoparticles are deposited on the dielectric layer by a plasma assisted deposition process such that each conductive nanoparticle is isolated from the other conductive nanoparticles. The conductive nanoparticles are configured as isolated material islands forming a charge storage layer. This charge storage layer may be covered by a top dielectric layer isolating the conductive nanoparticles, not only from each other, but from direct contact with a conductive medium. In an embodiment, the top dielectric layer may be of the same construction as the dielectric layer on which the conductive nanoparticles are deposited so as to effectively form one dielectric layer with conductive nanoparticles dispersed in the one dielectric layer. In an embodiment, the conductive nanoparticles are configured substantially in a plane on the dielectric layer. Alternatively, the conductive nanoparticles may be configured dispersed throughout a dielectric layer having at least a minimal distance from the bottom of the dielectric layer that is formed on a substrate.

In an embodiment, the size of the nanoparticles is increased by annealing to form isolated agglomerations of particles defining isolated enlarged islands of conductive material. In an embodiment, the size of the nanoparticles may be increased by a factor of about five. Enlargement by annealing is not limited to a factor of five, but may use other factors depending on the application. In an embodiment, a nanoparticle may have an effective or average diameter of about 2 nm that may be enlarged to about 10 nm by annealing. Nanoparticles are not limited to these dimensions, but may have other dimensions in various embodiments. The isolated structures, either as conductive nanoparticles or enlarged islands of conductive material, provide a means to reduce an effect associated with a defect that allows charge to leak through the dielectric on which the nanoparticles are formed. In a structure having isolated conductive nanoparticles, leakage may be localized to a few of these nanoparticles, reducing the amount of charge that may leak due to a defect, which may amount to only a few electrons. In an embodiment, conductive nanoparticles may be deposited by PECVD. In an embodiment, conductive nanoparticles may be deposited by PEALD. In an embodiment, conductive nanoparticles may be deposited by ALD followed by exposure to a plasma. In an embodiment, material may be deposited by ALD followed by exposing the material to a plasma to form nanoparticles. The material deposited by ALD may be in the form of nanoparticles, where the subsequent exposure to a plasma enhances the density of the nanoparticles. Herein, a process that includes atomic layer deposition followed by exposure to a plasma is referred to as plasma agglomerated atomic layer deposition or plasma agglomerated ALD. Though the exposure to a plasma in plasma agglomerated ALD may be post deposition with respect to a number of ALD deposition cycles, plasma agglomerated ALD is herein defined as a plasma-assisted deposition process. The flow of precursors in these plasma-assisted methods is controlled to provide for the formation of isolated nanoparticles such that a uniform layer of the deposited material is not formed.

In an embodiment, ruthenium nanoparticles are deposited on a dielectric layer using plasma assisted chemical vapor deposition. A capping dielectric layer may be formed on the ruthenium nanoparticles to create a charge storing unit. During processing subsequent to nanoparticle deposition, such as the formation of the capping dielectric layer, some of the ruthenium nanoparticles may oxidize. However, the oxidation may form conductive ruthenium oxide nanoparticles, which are applicable as conductive nanoparticles. Thus, selecting conductive nanoparticles that remain conductive on oxidation eases the constraints on subsequent processing.

In an example embodiment, ruthenium nanoparticles may be formed at a temperature of about 200° C. The processing wafer may be soaked in argon at 10 Torr for 2 minutes, after which a 30 second 200 sccm flow for 300 W Ar plasma may be conducted to stabilize the plasma. Then, a $(C_6H_8)Ru(CO)_3$ reactants may be switched to the reactant chamber at the same time as the argon is turned off. The delivery lines to a showerhead, held at about 50° C., may be heated to about 62° C. A 500 sccm He carrier gas may be used. The reactants may be controlled to flow for about 2 seconds providing ruthenium nanoparticles with a density of approximately $4 \times 10^{12}/cm^2$ (100-110 nanocrystals/50 nm×50 nm area). This is an example embodiment, other embodiments are not limited to these precursors and process parameters.

In an embodiment, ruthenium nanoparticles deposited on a dielectric layer may be capped with a dielectric layer. In various embodiments, the dielectric layer may be a plasma-enhanced tetraethylorthosilicate (PE-TEOS), a silicon oxide in the form of a high density plasma (HDP) oxide, a silicon oxide in the form of a high temperature oxide (HTO), a low temperature ALD oxide, a high temperature (such as 600° C.) ALD oxide, or a combination of an ALD oxide between the ruthenium nanoparticles and one of the other dielectric layers. A capping dielectric layer may be characteristic by the method used to form the capping dielectric layer. Charge storage structures including a capping dielectric layer on ruthenium nanoparticles deposited on a dielectric layer may have a range of program erase (P/E) windows.

In an embodiment, platinum nanoparticles may be deposited on a dielectric layer using plasma assisted chemical vapor deposition. In an example embodiment, platinum nanoparticles may be formed at a temperature of about 200° C. The processing wafer may be soaked in argon at 10 Torr for 2 minutes, after which a 30 second 200 sccm flow for 300 W Ar plasma may be conducted to stabilize the plasma. Then, $(CH_3)_3(CH_3C_5H_4)Pt$ and $O_2$ reactants may be switched to the reactant chamber at the same time as the argon is turned off. The delivery lines to a showerhead, held at about 50° C., may be heated to about 60° C. A 100 sccm He carrier gas may be used. The reactants may be controlled by flow for about 8 seconds providing platinum nanoparticles with a density of approximately $4 \times 10^2/cm^2$ (100-110 nanocrystals/50 nm×50 nm area). This is an example embodiment, other embodiments are not limited to these precursors and process parameters.

In an embodiment, platinum nanoparticles deposited on a dielectric layer may be capped with a dielectric layer. In various embodiments, the dielectric layer may be a PE-TEOS, a HDP oxide, a HTO oxide, a low temperature ALD oxide, a high temperature ALD oxide, or a combination of an ALD oxide between the platinum nanoparticles and one of the other dielectric layers. Structures including a capping dielectric layer on platinum nanoparticles deposited on a dielectric layer may have a range of P/E windows. In an embodiment, platinum nanoparticles on a dielectric layer with a top ALD oxide may provide a program/erase window of about 3.2 volts using 15V, 1 sec pulses with no degradation during subsequent cycles.

In an embodiment, platinum nanoparticles may be deposited on a dielectric layer using physical vapor deposition. The physical vapor deposition may be performed in short doses to provide the nanoparticles. A platinum sputter target may be exposed to an argon plasma for about 1-2 seconds to provide nanoparticles on a dielectric layer, where the nanoparticles are separated from each other. Other dosing periods may be used to provide spaced-apart platinum nanoparticles. PVD processing of platinum nanoparticles may be formed in a vacuum or at appropriately low pressures. In an embodiment, platinum nanoparticles may be processed by PVD at a pressure ranging from about $10^{-7}$ Torr to about $10^{-8}$ Torr. Other conductive elements and conductive combinations of elements may be used in a PVD process to provide spaced-apart conductive nanoparticles.

In an embodiment, platinum nanoparticles may be deposited on a dielectric layer using atomic layer deposition. Controlling nucleation sites for the platinum nanoparticles may provide spaced-apart platinum nanoparticles. The formation of the nanoparticles by ALD may be followed by other processes, such as plasma exposure, annealing, or combinations of post deposition processes, to enhance the density of the platinum nanoparticles.

In an embodiment, cobalt nanoparticles may be deposited on a dielectric layer using plasma agglomerated atomic layer deposition. ALD processing provides nucleation mechanism for generating the nanoparticles as isolated islands. A number of ALD cycles may be performed followed by exposure to a plasma for a given amount of time. An ALD cycle for depositing cobalt may consist of independently pulsing a cobalt-containing precursor, a purge gas, a reactant precursor, and another purge gas. Pulsing purge gases is performed to remove precursors and by-products from the reaction chamber after the precursors have been pulsed into the chamber for a specific time. For additional aid in removal of material, the purge pulse may be followed by evacuating the reaction chamber for a short period to pump out by-products and excess precursors. In an example embodiment, cobalt nanoparticles may be formed at a substrate temperature of about 325° C. in an ALD reactant chamber with the showerhead held at about 50° C. The ALD cycle may include a 4 sec pulse of $CpCo(CO)_2$, where the cyclopentadienyl (Cp) ligand is a monoanionic ligand with the formula $C_5H_5$. The $CpCo(CO)_2$ pulse may be followed by a 5 sec Ar purge followed by a 60 sec evacuation pump. After the purge/pump for the cobalt-containing precursor, a 2 sec $NH_3$ reactant precursor may be pulsed followed a 5 sec argon purge and a 10 sec evacuation pump to complete a cycle. In an embodiment, after conducting 10 cycles the deposited material may be exposed to a 10 second 300 watt 300 sccm Ar plasma to form cobalt nanoparticles. This is an example embodiment, other embodiments are not limited to these precursors and process parameters.

To form a charge storage unit, a capping dielectric may be formed on the cobalt nanoparticles. During the capping process or in subsequent processing, some cobalt nanoparticles may oxidize eliminating such structures as conductive nanoparticles. Processing at low temperatures may aid in reducing the amount of cobalt nanoparticles that oxidize. Further, choice of dielectrics used in the charge storage unit may aid in reducing the amount that the cobalt nanoparticles oxidize. Using dielectrics that do not contain oxygen, such as silicon nitride, may reduce any tendency for cobalt nanoparticles to oxidize. Alternatively, silicon oxide may be used for a tunneling oxide and a capping oxide with a barrier, or liner, layer between the cobalt nanoparticles and these oxides. Metal oxides may be used in which the metal oxygen bonding is structurally preferred such that cobalt nanoparticles do not oxidize as the metal oxide is formed on the cobalt nanoparticles.

Figure 2A:
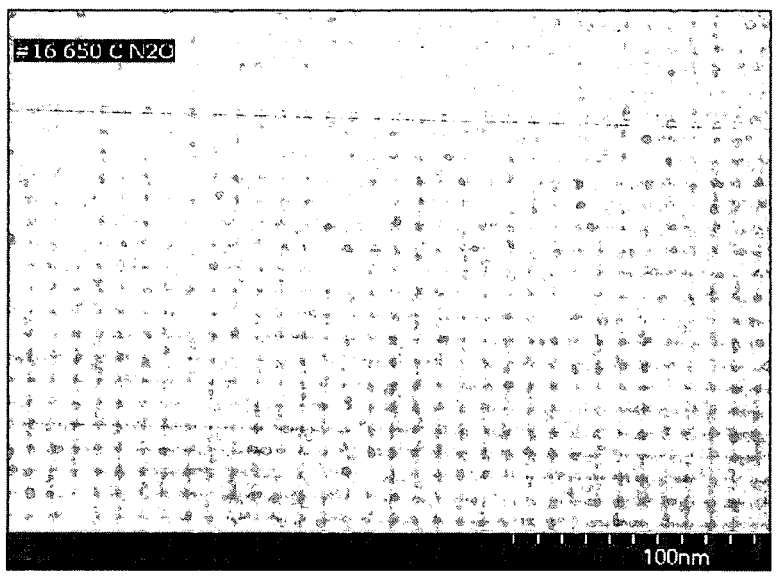
FIGS. 2A, 2B illustrate SEM images of an embodiment of platinum nanoparticles at 650° C. and 750° C.
Figure 2B:
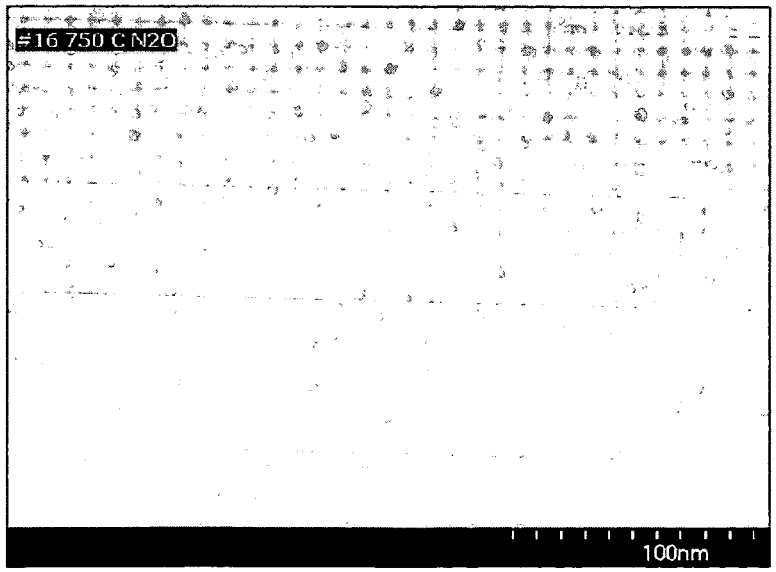
Figure 3A:
FIGS. 3A, 3B illustrate SEM images of an embodiment of platinum nanoparticles at 850° C. and 950° C.
Figure 3B:
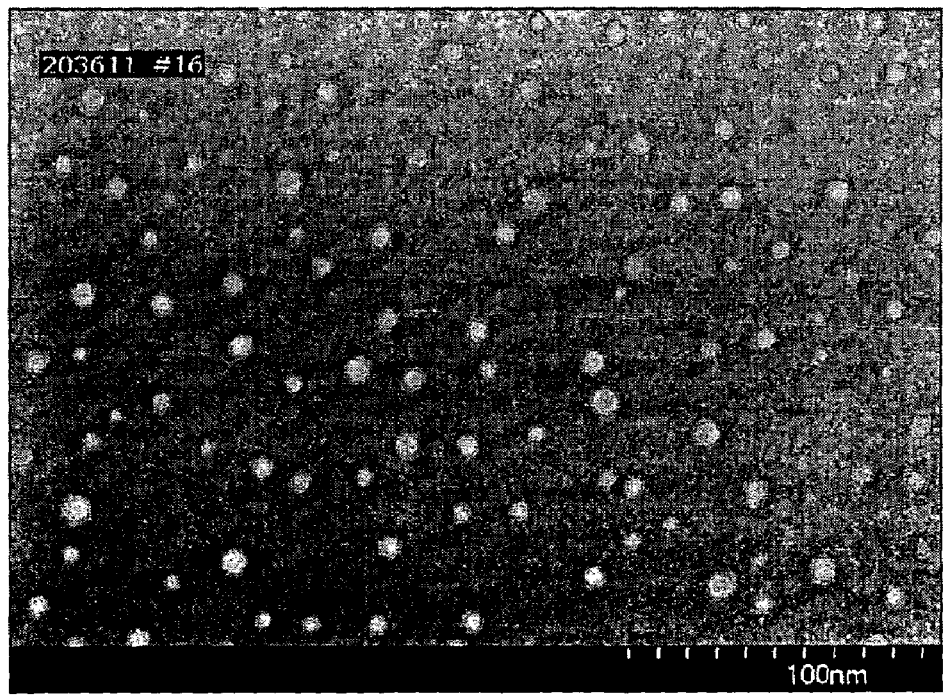

In an embodiment, the size of conductive nanoparticles may be increased by annealing. In an embodiment, platinum nanoparticles remain stable in an $N_2O$ atmosphere up to 650° C., but may begin to form an agglomeration at 750° C. FIGS. 2A, 2B illustrate SEM images of platinum nanoparticles at 650° C. and 750° C. In a $NH_3$ atmosphere, platinum nanoparticles may be stable up to 850° C., but may begin incremental agglomeration at 25° C. intervals above 850° C., with large crystals and spacing occurring at 950° C. FIGS. 3A, 3B illustrate SEM images of platinum nanoparticles at 850° C. and 950° C. By selectively controlling annealing, different formats for isolated conductive material may be formed allowing the selection of dense conductive nanoparticles or enlarged islands of conductive material with larger spacing, depending on the application. The spacing between isolated conductive regions may be correlated to the effective diameter of these isolated conductive regions.

Figure 4A:
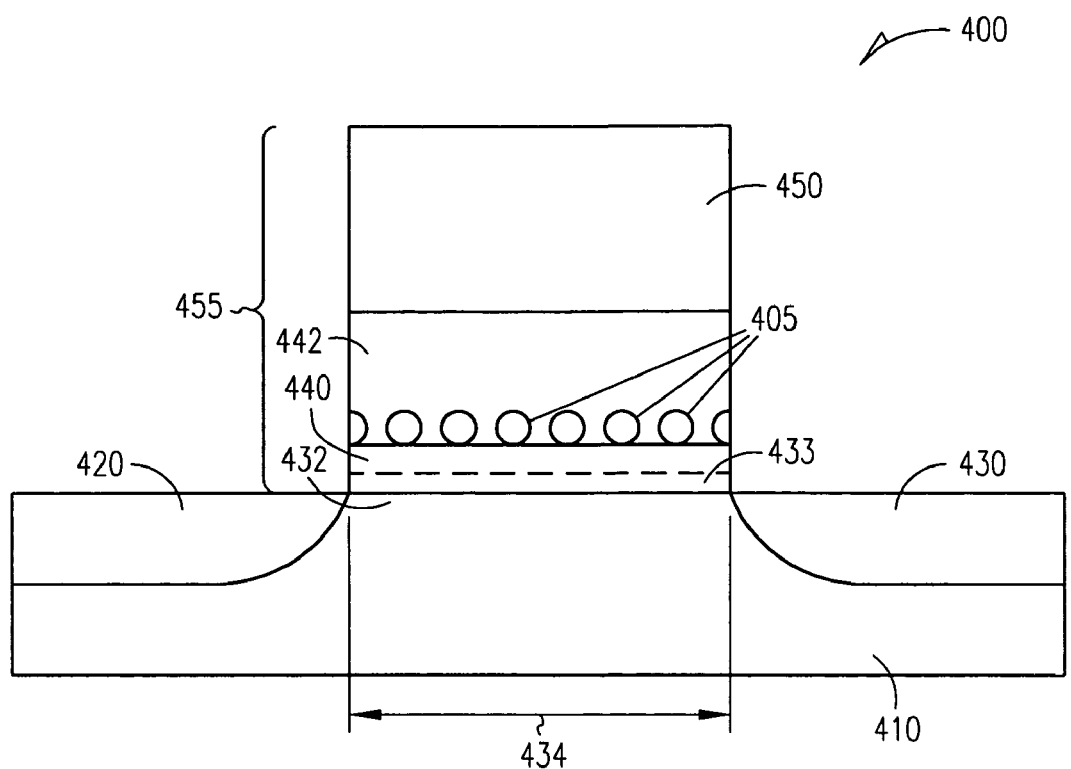
FIG. 4A depicts an embodiment of a configuration of a floating gate transistor having isolated conductive nanoparticles as its floating gate.

FIG. 4A shows an embodiment of a configuration of a floating gate transistor 400 having isolated conductive nanoparticles 405 as its floating gate. Transistor 400 includes a silicon based substrate 410 with a source 420 and a drain 430 separated by a body region 432. However, transistor 400 is not limited to silicon based substrates, but may be used with a variety of semiconductor and insulating substrates. Body region 432 between source 420 and drain 430 defines a channel region having a channel length 434. Located above body region 432 is a stack 455 including a gate dielectric 440, conductive nanoparticles 405 as a floating gate, a floating gate dielectric 442, and a control gate 450. An interfacial layer 433 may form between body region 432 and gate dielectric 440. In an embodiment, interfacial layer 433 may be limited to a relatively small thickness compared to gate dielectric 440, or to a thickness significantly less than gate dielectric 440 as to be effectively eliminated.

Conductive nanoparticles 405 may be structured as a layer of spaced-apart conductive particles. Alternatively, the conductive nanoparticles may be structured as a number of layers of spaced-apart conductive particles. In an embodiment, the number of layers, or thickness of the film of isolated conductive nanoparticles, is selected to provide charge trapping to the various levels of conductive nanoparticles by a tunneling mechanism. Such a thickness or distance from body region 432 is dependent on the application. Conductive nanoparticles 405 may include, but are not limited to, platinum nanoparticles, ruthenium nanoparticles, conductive ruthenium oxide nanoparticles, nanoparticles of other transition metals (W, Ni, etc.), noble metals (Rh, Ir, Pd, etc.), conductive metal oxides, conductive nitrides, and other conductive compounds.

Gate dielectric 440 may be configured as a tunneling dielectric. In an embodiment, gate dielectric 440 has a thickness, measured as the shortest distance from body region 432 to a conductive nanoparticle, of 30 Å or less. In an embodiment, floating dielectric 442 has a thickness, measured as the shortest distance from control gate 450 to a conductive nanoparticle, between about 100 Å and about 150 Å. Gate dielectric 440 and floating gate 442 made be composed of the same component materials or different component materials. The insulating materials selected for gate dielectric 440 and floating gate dielectric 442 may be selected to reduce or eliminate oxidation of the conductive nanoparticles during processing subsequent to their formation. The material for gate dielectric 440 and floating gate dielectric 442 may include, but is not limited to, silicon oxide, insulating nitrides, insulating oxynitrides, and high-κ dielectric materials. Gate dielectric 440 and floating gate dielectric 442 may each be structured as a single dielectric layer or as a dielectric stack.

Various embodiments for charge storage units using isolated conductive nanoparticles on a dielectric layer may provide for enhanced device performance by providing devices with reduced leakage current. In a floating gate transistor, a number of conductive nanoparticles replace a conventional floating gate that may be considered to be structured as a plate. Leakage for a conventional floating gate or for an embodiment of conductive nanoparticles may typically be determined by defects, which are not uniform in the structure. If the leakage is mainly by defects, then using isolated conductive nanoparticles, only a few of the nanoparticles are associated with the defects from which charge may leak. With a few associated leakage sites, such leakage may be ignored since it is associated with charge trapped in a few nanoparticles. However, with a conventional plate configuration, the entire plate is conductively coupled associating non-uniform defects with the entire plate such that charge may be conducted to the defects, increasing the amount of leakage charge. With a much lower leakage associated with the conductive nanoparticles as compared with the conventional floating gate, thinner gate dielectric 440 may be used with the conductive nanoparticles. Further, structures with thinner gate dielectric 440 also allow the use of lower voltages to program charge in floating transistor 400.

Figure 4B:
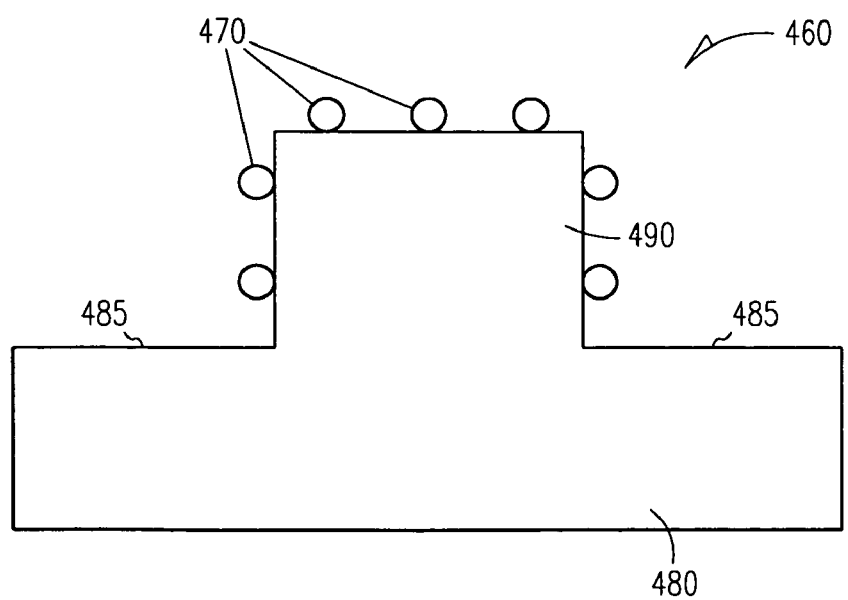
FIG. 4B depicts an embodiment of a three-dimensional structure of isolated conductive nanoparticles.

In an embodiment, conductive nanoparticles may be configured with a structure having three-dimensional features rather than a flat structure. A flat structure may be considered to be a planar structure whose three-dimensional aspect is provided by having a uniform or gradual-varying thickness. FIG. 4B shows an embodiment of a structure 460 having spaced-apart conductive nanoparticles 470 with three-dimensional features. Conductive nanoparticles 470 may be formed on a dielectric layer 480 having stud 490 protruding up from a surface 485 of dielectric layer 480. Conductive nanoparticles 470 may be disposed around vertical and horizontal sides of stud 490. Stud 490 is not limited to having perpendicular walls, but may be have various shapes protruding from surface 485 of dielectric layer 480. Various embodiments provide conductive nanoparticles as a charge storage unit configured in multiple planes or in a non-planar arrangement. Structure 460 may be used in the floating gate transistor 400 of FIG. 4A.

Additional improvements in leakage current characteristics may be attained by forming one or more of gate dielectric 440 and floating gate 442 in a nanolaminate structure. The transition from one layer of the nanolaminate to another layer of the nanolaminate provides further disruption to a tendency for an ordered structure in the nanolaminate stack, eliminating the occurrence of convenient paths from body region 432 to conductive nanoparticles 405.

Transistors and other devices having isolated conductive nanoparticles on a dielectric layer may be implemented into memory devices and electronic systems including information handling devices. Embodiments of these information handling devices may include telecommunication systems, wireless systems, and computers.

Figure 5:
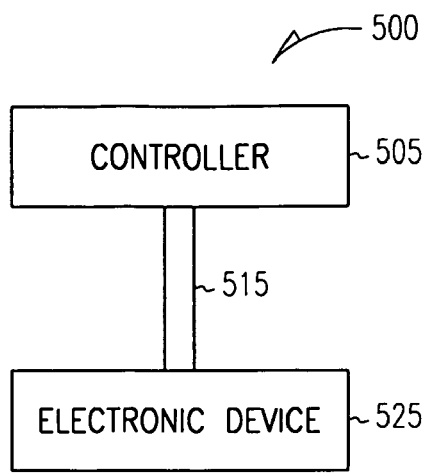
FIG. 5 is a simplified block diagram for an embodiment of an electronic system having a controller coupled to an electronic device, where the controller and/or the electronic device have a charge storage unit configured as isolated conductive nanoparticles on a dielectric layer.

FIG. 5 is a simplified block diagram for an embodiment of an electronic system 500 having a controller 505 coupled to an electronic device 525, where controller 505 and/or electronic device 525 have a charge storage unit configured as isolated conductive nanoparticles on a dielectric layer, in accordance with various embodiments. Electronic system 500 includes a bus 515, where bus 515 provides electrical conductivity between controller 505 and electronic device 525. Electronic system 500 may include, but is not limited to, information handling devices, wireless systems, telecommunication systems, fiber optic systems, electro-optic systems, and computers.

Figure 6:
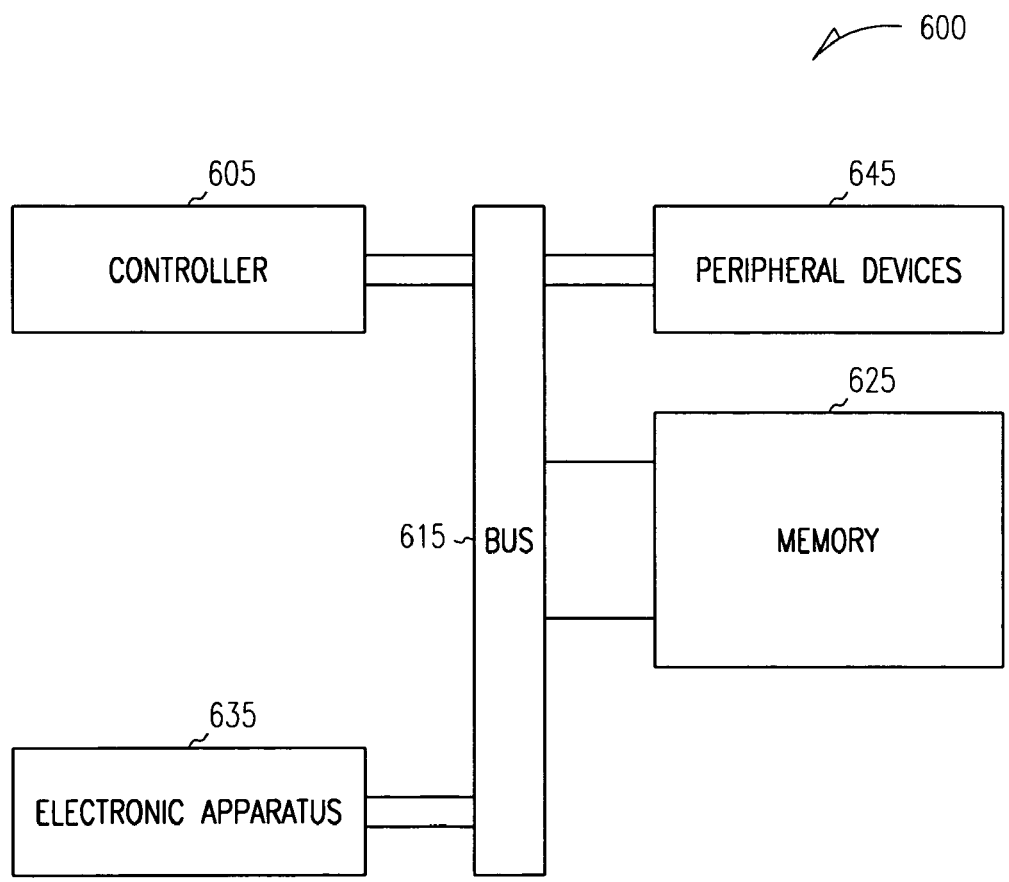
FIG. 6 illustrates a block diagram for an embodiment of an electronic system having a charge storage unit configured as isolated conductive nanoparticles on a dielectric layer.

FIG. 6 illustrates a block diagram for an embodiment of an electronic system 600 having a charge storage unit configured as isolated conductive nanoparticles on a dielectric layer. System 600 may include a controller 605, a memory 625, an electronic apparatus 635, and a bus 615, where bus 615 provides electrical conductivity between controller 605 and electronic apparatus 635, and between controller 605 and memory 625. Bus 615 may include an address bus, a data bus, and a control bus, each independently configured. Alternatively, bus 615 may use common conductive lines for providing address, data, and/or control, the use of which is regulated by controller 605. In an embodiment, electronic apparatus 635 may be additional memory configured similar as memory 625. An embodiment may include an additional peripheral device or devices 645 coupled to bus 615. In an embodiment, controller 605 is a processor. In an embodiment, controller 605 is a processor having a memory. Any of controller 605, memory 625, bus 615, electronic apparatus 635, and peripheral device devices 645 may include an embodiment of a charge storage unit configured as isolated conductive nanoparticles on a dielectric layer. System 600 may include, but is not limited to, information handling devices, telecommunication systems, and computers.

Peripheral devices 645 may include displays, additional storage memory, or other control devices that may operate in conjunction with controller 605. Alternatively, peripheral devices 645 may include displays, additional storage memory, or other control devices that may operate in conjunction with controller 605 and/or memory 625.

Memory 625 may be realized as a memory device having a charge storage unit configured as isolated conductive nanoparticles on a dielectric layer, in accordance with various embodiments. It will be understood that embodiments are equally applicable to any size and type of memory circuit and are not intended to be limited to a particular type of memory device. In an embodiment, a flash memory may include an array of memory cells, each memory cell having a charge storage unit configured as isolated conductive nanoparticles on a dielectric layer. The conductive nanoparticles of a charge storage unit serve as a charge trapping layer instead of a structure having a polysilicon floating gate, as discussed with respect to embodiments associated with FIGS. 4A-4B. Each charge storage unit may be accessed using word lines, where the conductive nanoparticles provide for reduction of word line coupling. In addition, the conductive nanoparticles enable the use of reduced programming voltages and provide enhanced charge leakage characteristics. Such properties may provide for increased density of memory cells.

Although specific embodiments have been illustrated and described herein, it will be appreciated by those of ordinary skill in the art that any arrangement that is calculated to achieve the same purpose may be substituted for the specific embodiments shown. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description.

What is claimed is:

1. A method of forming an electronic device, the method comprising:
   forming a dielectric layer in an integrated circuit on a substrate;
   forming, after forming the dielectric layer, conductive nanoparticles on the formed dielectric layer, the conductive nanoparticles formed by a plasma-assisted deposition process such that each conductive nanoparticle is isolated from the other conductive nanoparticles, the conductive nanoparticles including one or more of conductive metals, metal-containing compounds, or combinations of metal and metal-containing compound;
   applying a plasma to the conductive nanoparticles such that the conductive nanoparticles are roughened by the plasma;
   forming, after forming the conductive nanoparticles, a capping dielectric layer on and contacting the formed conductive nanoparticles and contacting the dielectric layer, the capping dielectric layer providing isolation from conductive elements, wherein forming the conductive nanoparticles is performed separate from forming the dielectric layer and from forming the capping dielectric layer; and
   configuring the conductive nanoparticles as charge storage elements.

2. The method of claim 1, wherein the forming conductive nanoparticles includes forming the conductive nanoparticles such that spacing between the conductive nanoparticles is at about an effective diameter of a conductive nanoparticle.

3. The method of claim 1, wherein the forming conductive nanoparticles includes forming metal nanoparticles.

4. The method of claim 1, wherein the forming conductive nanoparticles includes forming conductive metal oxide nanoparticles.

5. The method of claim 1, wherein the forming conductive nanoparticles includes forming platinum nanoparticles.

6. The method of claim 1, wherein the forming conductive nanoparticles includes forming ruthenium nanoparticles.

7. The method of claim 1, wherein the forming conductive nanoparticles includes forming cobalt nanoparticles.

8. The method of claim 1, wherein the forming conductive nanoparticles includes forming conductive ruthenium oxide nanoparticles.

9. The method of claim 1, wherein the forming conductive nanoparticles on the dielectric layer by a plasma-assisted deposition process includes forming conductive nanoparticles on the dielectric layer by plasma-enhanced chemical vapor deposition.

10. The method of claim 1, wherein the forming conductive nanoparticles on the dielectric layer by a plasma-assisted deposition process includes forming conductive nanoparticles on the dielectric layer by physical vapor deposition.

11. The method of claim 1, wherein the forming conductive nanoparticles on the dielectric layer includes configuring the conductive nanoparticles such that a plurality of the conductive nanoparticles are disposed on a first plane and another plurality of the conductive nanoparticles are disposed on a second plane, the second plane intersecting the first plane.

12. The method of claim 1, wherein the forming conductive nanoparticles on the dielectric layer includes forming the conductive nanoparticles on a protrusion extending from the dielectric layer, the protrusion having vertical sides extending from a surface of the dielectric layer to a top of the protrusion, with at least one of the conductive nanoparticles formed on and contacting the top of the protrusion and at least one of the conductive nanoparticles formed on and contacting each of the vertical sides of the protrusion.

13. The method of claim 1, wherein the method includes forming the capping dielectric layer over the conductive nanoparticles by atomic layer deposition.

14. The method of claim 1, wherein the method includes forming the capping dielectric layer over the conductive nanoparticles at a temperature below 600° C.

15. The method of claim 1, wherein the method includes forming a transistor having the conductive nanoparticles as a gate.

16. The method of claim 15, wherein the method includes forming the conductive nanoparticles as a floating gate.

17. The method of claim 1, wherein the method includes forming the conductive nanoparticles as a charge storage layer in a memory device.

18. The method of claim 1, wherein the method includes forming connections to couple the integrated circuit to components of an electronic system.

19. The method of claim 1, wherein the method includes annealing the conductive nanoparticles at a temperature and for a period of time such that isolated enlarged islands of agglomerated conductive nanoparticles are formed.

20. The method of claim 1, wherein the forming, after forming the dielectric layer, conductive nanoparticles includes forming conductive nanoparticles containing iridium.

21. The method of claim 1, wherein the method includes annealing, after forming the conductive nanoparticles and before forming the capping dielectric layer, at a temperature and for a period of time such that the size of the conductive nanoparticles is enlarged along with the isolation of each conductive nanoparticle from the other conductive nanoparticles.

22. The method of claim 1, wherein the forming conductive nanoparticles includes forming rhodium conductive nanoparticles.

23. The method of claim 22, wherein the forming a dielectric layer includes forming a hafnium oxide layer.

24. The method of claim 22, wherein the forming a dielectric layer includes forming a high-K dielectric layer.

25. A method of forming an electronic device, the method comprising:
   forming a dielectric layer in an integrated circuit on a substrate;
   depositing, after forming the dielectric layer, conductive nanoparticles on the formed dielectric layer by a plasma-assisted deposition process such that each conductive nanoparticle is isolated from the other conductive nanoparticles to configure the conductive nanoparticles as charge storage elements; and
   forming, after depositing the conductive nanoparticles, a capping dielectric layer on and contacting the deposited conductive nanoparticles and contacting the dielectric layer, the capping dielectric layer to provide isolation from conductive elements, wherein depositing the conductive nanoparticles is performed separate from forming the dielectric layer and from forming the capping dielectric layer, wherein the depositing conductive nanoparticles on the dielectric layer by a plasma-assisted deposition process includes depositing conductive nanoparticles on the dielectric layer by plasma agglomerated atomic layer deposition.

26. The method of claim 25, wherein the forming, after forming the dielectric layer, conductive nanoparticles includes forming conductive nanoparticles containing iridium.

27. The method of claim 26, wherein the forming a dielectric layer in an integrated circuit on a substrate includes forming silicon oxide on a silicon based substrate.

28. The method of claim 25, wherein the forming conductive nanoparticles includes forming rhodium conductive nanoparticles.

29. The method of claim 28, wherein the forming a dielectric layer includes forming a hafnium oxide layer.

30. The method of claim 28, wherein the forming a dielectric layer includes forming an insulative oxynitride layer.

31. A method of forming an electronic device, the method comprising:
forming a dielectric layer in an integrated circuit on a substrate, the dielectric layer including a high-K dielectric material;
forming, after forming the dielectric layer, conductive nanoparticles on the formed dielectric layer, the conductive nanoparticles formed by atomic layer deposition such that each conductive nanoparticle is isolated from the other conductive nanoparticles, the conductive nanoparticles configured as charge storage elements;
roughening the formed conductive nanoparticles, after forming the conductive nanoparticles on the formed dielectric layer, by applying a plasma to the formed conductive nanoparticles; and
forming a capping dielectric layer on and contacting the formed conductive nanoparticles and contacting the dielectric layer, the capping dielectric layer providing isolation from conductive elements, wherein forming the conductive nanoparticles is performed separate from forming the dielectric layer and from forming the capping dielectric layer.

32. The method of claim 31, wherein the forming conductive nanoparticles by atomic layer deposition includes forming platinum nanoparticles by atomic layer deposition.

33. The method of claim 32, wherein the method includes forming a transistor having the platinum nanoparticles as a gate.

34. The method of claim 33, wherein the method includes forming the platinum nanoparticles as a floating gate.

35. The method of claim 33, wherein the method includes forming the platinum nanoparticles as a charge storage layer in a memory device.

36. The method of claim 32, wherein the method includes forming connections to couple the integrated circuit to components of an electronic system.

37. The method of claim 31, wherein the forming, after forming the dielectric layer, conductive nanoparticles includes forming conductive nanoparticles containing iridium.

38. The method of claim 31, wherein the forming conductive nanoparticles includes forming rhodium conductive nanoparticles.

39. The method of claim 38, wherein the forming a dielectric layer includes forming a hafnium oxide layer.

40. The method of claim 38, wherein the forming a dielectric layer includes forming a dielectric nanolaminate.

41. A method of forming an electronic device, the method comprising:
forming a dielectric layer in an integrated circuit on a substrate;
forming, after forming the dielectric layer, platinum nanoparticles on the formed dielectric layer, the platinum nanoparticles formed by a plasma-enhanced chemical vapor deposition process such that each platinum nanoparticle is isolated from the other platinum nanoparticles, the platinum nanoparticles configured as charge storage elements;
applying a plasma to the platinum nanoparticles such that the platinum nanoparticles are roughened by the plasma; and
forming, after forming the platinum nanoparticles, a capping dielectric layer on and contacting the formed platinum nanoparticles and contacting the dielectric layer, the capping dielectric layer providing isolation from conductive elements, wherein forming the platinum nanoparticles is performed separate from forming the dielectric layer and from forming the capping dielectric layer.

42. The method of claim 41, wherein the forming platinum nanoparticles on the dielectric layer by a plasma-enhanced chemical vapor deposition process includes using an argon plasma.

43. The method of claim 41, wherein the forming platinum nanoparticles includes depositing the platinum nanoparticles having a density of about 100 to 110 nanoparticles per 50 nm×50 nm area.

44. The method of claim 41, wherein the method includes, after forming the platinum nanoparticles, each having a size, selectively annealing the platinum nanoparticles at a temperature and for a period of time such that the sizes of the platinum nanoparticles are enlarged.

45. The method of claim 44, wherein the selectively annealing the platinum nanoparticles includes annealing the platinum in an environment and at a temperature agglomerating the platinum nanoparticles forming larger particles with increased spacing between the larger particles.

46. A method of forming an electronic device, the method comprising:
forming a dielectric layer in an integrated circuit on a substrate;
depositing, after forming the dielectric layer, platinum nanoparticles on the formed dielectric layer by a plasma-enhanced chemical vapor deposition process such that each platinum nanoparticle is isolated from the other platinum nanoparticles, the platinum nanoparticles configured as charge storage elements; and
forming, after depositing the platinum nanoparticles, a capping dielectric layer on and contacting the deposited platinum nanoparticles and contacting the dielectric layer, the capping dielectric layer to provide isolation from conductive elements, wherein depositing the platinum nanoparticles is performed separate from forming the dielectric layer and from forming the capping dielectric layer, wherein the depositing platinum nanoparticles on the dielectric layer by a plasma-enhanced chemical vapor deposition process includes using $(CH_3)_3(CH_3C_5H_4)Pt$ and $O_2$ as precursors.

47. A method of forming an electronic device, the method comprising:
forming a dielectric layer in an integrated circuit on a substrate;
depositing, after forming the dielectric layer, platinum nanoparticles on the formed dielectric layer by a plasma-enhanced chemical vapor deposition process such that each platinum nanoparticle is isolated from the other platinum nanoparticles, the platinum nanoparticles configured as charge storage elements; and forming, after depositing the platinum nanoparticles, a capping dielectric layer on and contacting the deposited platinum nanoparticles and contacting the dielectric layer, the capping dielectric layer to provide isolation from conductive elements, wherein depositing the platinum nanoparticles is performed separate from forming the dielectric layer and from forming the capping dielectric layer, wherein the depositing platinum nanoparticles on the dielectric layer by a plasma-enhanced chemical vapor deposition process includes using a $(CH_3)_3(CH_3C_5H_4)Pt$ precursor and one or more precursors of $N_2O$, $O_3$, or NO.

48. A method of forming an electronic device, the method comprising:
    forming a dielectric layer in an integrated circuit on a substrate;
    depositing, after forming the dielectric layer, platinum nanoparticles on the formed dielectric layer by a plasma-enhanced chemical vapor deposition process such that each platinum nanoparticle is isolated from the other platinum nanoparticles, the platinum nanoparticles configured as charge storage elements;
    forming, after depositing the platinum nanoparticles, a capping dielectric layer on and contacting the deposited platinum nanoparticles and contacting the dielectric layer, the capping dielectric layer to provide isolation from conductive elements, wherein depositing the platinum nanoparticles is performed separate from forming the dielectric layer and from forming the capping dielectric layer; and
    controlling platinum nanoparticle size by selectively annealing the platinum nanoparticles, wherein the selectively annealing the platinum nanoparticles includes annealing the platinum nanoparticles in a $N_2O$ environment at temperatures up to 650° C.

49. A method of forming an electronic device, the method comprising:
    forming a dielectric layer in an integrated circuit on a substrate;
    depositing, after forming the dielectric layer, platinum nanoparticles on the formed dielectric layer by a plasma-enhanced chemical vapor deposition process such that each platinum nanoparticle is isolated from the other platinum nanoparticles, the platinum nanoparticles configured as charge storage elements; and
    forming, after depositing the platinum nanoparticles, a capping dielectric layer on and contacting the deposited platinum nanoparticles and contacting the dielectric layer, the capping dielectric layer to provide isolation from conductive elements, wherein depositing the platinum nanoparticles is performed separate from forming the dielectric layer and from forming the capping dielectric layer; and
    controlling platinum nanoparticle size by selectively annealing the platinum nanoparticles, wherein the selectively annealing the platinum nanoparticles includes annealing the platinum nanoparticles in a $NH_3$ environment at temperatures up to 850° C.

50. A method of forming an electronic device, the method comprising:
    forming a dielectric layer in an integrated circuit on a substrate;
    forming, after forming the dielectric layer, ruthenium nanoparticles on the formed dielectric layer, the ruthenium nanoparticles formed by a plasma-enhanced chemical vapor deposition process such that each ruthenium nanoparticle is isolated from the other ruthenium nanoparticles, the ruthenium nanoparticles configured as charge storage elements;
    applying a plasma to the ruthenium nanoparticles such that the ruthenium nanoparticles are roughened by the plasma; and
    forming, after forming the ruthenium nanoparticles, a capping dielectric layer on and contacting the formed ruthenium nanoparticles and contacting the dielectric layer, the capping dielectric layer providing isolation from conductive elements, wherein forming the ruthenium nanoparticles is performed separate from forming the dielectric layer and from forming the capping dielectric layer.

51. The method of claim 50, wherein the forming ruthenium nanoparticles on the dielectric layer by a plasma-enhanced chemical vapor deposition process includes using an argon plasma.

52. The method of claim 50, wherein the forming ruthenium nanoparticles includes forming the ruthenium nanoparticles having a density of about 100 to 110 nanoparticles per 50 nm×50 nm area.

53. The method of claim 50, wherein the method includes, after forming the ruthenium nanoparticles, each having a size, selectively annealing the ruthenium nanoparticles at a temperature and for a period of time such that the sizes of the ruthenium nanoparticles are enlarged.

54. The method of claim 53, wherein the selectively annealing the ruthenium nanoparticles includes annealing the ruthenium in an environment and at a temperature agglomerating the ruthenium nanoparticles forming larger particles with increased spacing between the larger particles.

55. A method of forming an electronic device, the method comprising:
    forming a dielectric layer in an integrated circuit on a substrate;
    depositing, after forming the dielectric layer, ruthenium nanoparticles on the formed dielectric layer by a plasma-enhanced chemical vapor deposition process such that each ruthenium nanoparticle is isolated from the other ruthenium nanoparticles, the ruthenium nanoparticles configured as charge storage elements; and
    forming, after depositing the ruthenium nanoparticles, a capping dielectric layer on and contacting the deposited ruthenium nanoparticles and contacting the dielectric layer, the capping dielectric layer to provide isolation from conductive elements, wherein depositing the ruthenium nanoparticles is performed separate from forming the dielectric layer and from forming the capping dielectric layer, wherein the depositing ruthenium nanoparticles on the dielectric layer by a plasma-enhanced chemical vapor deposition process includes using a $(C_6H_8)Ru(CO)_3$ precursor.

56. A method of forming an electronic device, the method comprising:
    forming a dielectric layer in an integrated circuit on a substrate; and
    depositing, after forming the dielectric layer, cobalt nanoparticles on the formed dielectric layer by a plasma agglomerated atomic layer deposition process such that each cobalt nanoparticle is isolated from the other cobalt nanoparticles, the cobalt nanoparticles configured as charge storage elements; and
    forming, after depositing the cobalt nanoparticles, a capping dielectric layer on and contacting the deposited cobalt nanoparticles and contacting the dielectric layer, the capping dielectric layer to provide isolation from conductive elements, wherein depositing the cobalt nanoparticles is performed separate from forming the dielectric layer and from forming the capping dielectric layer.

57. The method of claim 56, wherein the depositing cobalt nanoparticles on the dielectric layer by an atomic layer deposition process includes using a $C_5H_5Co(CO)_2$ precursor and one or more of a $NH_3$ precursor or a $H_2$ precursor.

58. The method of claim 56, wherein the depositing cobalt nanoparticles on the dielectric layer by an atomic layer deposition includes using an argon plasma at the completion of a number of ALD cycles.

59. The method of claim 58, wherein the using an argon plasma at the completion of a number of ALD cycles includes using an argon plasma at the completion of ten ALD cycles.

60. The method of claim 56, wherein the depositing cobalt nanoparticles includes depositing the cobalt nanoparticles having a density of about 100 to 110 nanoparticles per 50 nm×50 nm area.

61. A method of forming a memory, the method comprising:
   forming an array of memory cells, each memory cell having a charge storage unit structured by:
      forming a dielectric layer on a substrate;
      forming, after forming the dielectric layer, conductive nanoparticles on the formed dielectric layer, the conductive nanoparticles formed by a plasma-assisted deposition process such that each conductive nanoparticle is isolated from the other conductive nanoparticles, the conductive nanoparticles configured as charge storage elements, the conductive nanoparticles including one or more of conductive metals, metal-containing compounds, or combinations of metal and metal-containing compound;
      applying a plasma to the conductive nanoparticles such that the conductive nanoparticles are roughened by the plasma; and
      forming, after forming the conductive nanoparticles, a capping dielectric layer on and contacting the formed conductive nanoparticles and contacting the dielectric layer, the capping dielectric layer to provide isolation from conductive elements, wherein forming the conductive nanoparticles is performed separate from forming the dielectric layer and from forming the capping dielectric layer.

62. The method of claim 61, wherein the forming, after forming the dielectric layer, conductive nanoparticles includes forming conductive nanoparticles containing iridium.

63. The method of claim 61, wherein the forming conductive nanoparticles includes forming the conductive nanoparticles such that spacing between the conductive nanoparticles is at about an effective diameter of a conductive nanoparticle.

64. The method of claim 61, wherein the forming conductive nanoparticles includes forming metal nanoparticles.

65. The method of claim 61, wherein the forming conductive nanoparticles includes forming conductive metal oxide nanoparticles.

66. The method of claim 61, wherein the forming conductive nanoparticles includes forming platinum nanoparticles.

67. The method of claim 61, wherein the forming conductive nanoparticles includes forming ruthenium nanoparticles.

68. The method of claim 61, wherein the forming conductive nanoparticles includes forming cobalt nanoparticles.

69. The method of claim 61, wherein the forming conductive nanoparticles includes forming conductive ruthenium oxide nanoparticles.

70. The method of claim 61, wherein the method includes forming the capping dielectric layer over the conductive nanoparticles by atomic layer deposition.

71. The method of claim 61, wherein the method includes forming the capping dielectric layer over the conductive nanoparticles at a temperature below 600° C.

72. The method of claim 61, wherein the method includes forming a transistor having the conductive nanoparticles as a floating gate.

73. A method of forming an electronic system, the method comprising:
   providing a controller; and
   coupling an electronic apparatus to the controller, wherein one or both of the controller or the electronic apparatus are formed by a method including:
      forming a dielectric layer on a substrate;
      forming, after forming the dielectric layer, conductive nanoparticles on the formed dielectric layer, the conductive nanoparticles formed by a plasma-assisted deposition process such that each conductive nanoparticle is isolated from the other conductive nanoparticles, the conductive nanoparticles including one or more of conductive metals, metal-containing compounds, or combinations of metal and metal-containing compound, the conductive nanoparticles configured as charge storage elements;
      applying a plasma to the conductive nanoparticles such that the conductive nanoparticles are roughened by the plasma; and
      forming, after forming the conductive nanoparticles, a capping dielectric layer on and contacting the formed conductive nanoparticles and contacting the dielectric layer, the capping dielectric layer providing isolation from conductive elements, wherein forming the conductive nanoparticles is performed separate from forming the dielectric layer and from forming the capping dielectric layer.

74. The method of claim 73, wherein the forming conductive nanoparticles includes forming the conductive nanoparticles such that spacing between the conductive nanoparticles is at about an effective diameter of a conductive nanoparticle.

75. The method of claim 73, wherein the forming conductive nanoparticles includes forming metal nanoparticles.

76. The method of claim 73, wherein the forming conductive nanoparticles includes forming conductive metal oxide nanoparticles.

77. The method of claim 73, wherein the forming conductive nanoparticles includes forming nanoparticles of a multiple element conductive compound.

78. The method of claim 73, wherein the method includes forming a transistor having the conductive nanoparticles as a floating gate.

* * * * *

UNITED STATES PATENT AND TRADEMARK OFFICE
CERTIFICATE OF CORRECTION

PATENT NO. : 7,575,978 B2  Page 1 of 1
APPLICATION NO. : 11/197184
DATED : August 18, 2009
INVENTOR(S) : Brenda D Kraus et al.

It is certified that error appears in the above-identified patent and that said Letters Patent is hereby corrected as shown below:

In column 10, line 47, in Claim 24, delete "high-K" and insert -- high-κ --, therefor.

In column 11, line 20, in Claim 31, delete "high-K" and insert -- high-κ --, therefor.

Signed and Sealed this

Tenth Day of November, 2009

David J. Kappos
*Director of the United States Patent and Trademark Office*